(12) United States Patent
Jeong et al.

(10) Patent No.: US 9,647,089 B2
(45) Date of Patent: May 9, 2017

(54) THIN FILM TRANSISTOR SUBSTRATE, DISPLAY APPARATUS INCLUDING THE SAME, METHOD OF MANUFACTURING THIN FILM TRANSISTOR SUBSTRATE, AND METHOD OF MANUFACTURING DISPLAY APPARATUS

(71) Applicant: SAMSUNG DISPLAY CO., LTD., Yongin, Gyeonggi-Do (KR)

(72) Inventors: Woonghee Jeong, Yongin (KR); Joonhwa Bae, Yongin (KR); Youngki Shin, Yongin (KR); Yoonho Khang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/696,257

(22) Filed: Apr. 24, 2015

(65) Prior Publication Data

US 2016/0104726 A1    Apr. 14, 2016

(30) Foreign Application Priority Data

Oct. 8, 2014 (KR) .................... 10-2014-0135964

(51) Int. Cl.
*H01L 29/78* (2006.01)
*H01L 29/66* (2006.01)
*H01L 29/786* (2006.01)
*H01L 27/12* (2006.01)
*H01L 21/02* (2006.01)

(52) U.S. Cl.
CPC .... *H01L 29/66757* (2013.01); *H01L 27/1281* (2013.01); *H01L 29/78675* (2013.01); *H01L 21/02532* (2013.01); *H01L 21/02675* (2013.01)

(58) Field of Classification Search
CPC .......... H01L 21/02362; H01L 27/1222; H01L 29/42384; H01L 29/66765
See application file for complete search history.

(56) References Cited

U.S. PATENT DOCUMENTS

| | | | |
|---|---|---|---|
| 2003/0122096 A1* | 7/2003 | Bush | ........................ F16K 3/08 251/148 |
| 2007/0145017 A1 | 6/2007 | Im et al. | |
| 2008/0157094 A1* | 7/2008 | Seo | ........................ H01L 29/04 257/72 |
| 2013/0075731 A1 | 3/2013 | Han et al. | |

FOREIGN PATENT DOCUMENTS

| | | |
|---|---|---|
| JP | 2001-297985 A | 10/2001 |
| JP | 2003-115496 A | 4/2003 |
| KR | 10-2012-0116616 A | 10/2012 |

OTHER PUBLICATIONS

Kim, H.J. et al., "New excimer-laser-crystallization method for producing large-grained and grain boundary-location-controlled Si films for thin film transistors", Applied Physics Letters, Mar. 11, 1996, pp. 1513-1515, vol. 68.

* cited by examiner

*Primary Examiner* — Armando Rodriguez
(74) *Attorney, Agent, or Firm* — Lewis Roca Rothgerber Christie LLP

(57) ABSTRACT

Thin film transistor substrate includes: a substrate; a crystalline silicon layer on the substrate; and a capping layer covering the crystalline silicon layer and including a first portion having a first thickness and a second portion having a second thickness that is greater than the first thickness.

17 Claims, 2 Drawing Sheets

THIN FILM TRANSISTOR SUBSTRATE, DISPLAY APPARATUS INCLUDING THE SAME, METHOD OF MANUFACTURING THIN FILM TRANSISTOR SUBSTRATE, AND METHOD OF MANUFACTURING DISPLAY APPARATUS

CROSS-REFERENCE TO RELATED APPLICATION

This application claims priority to and the benefit of Korean Patent Application No. 10-2014-0135964, filed on Oct. 8, 2014 in the Korean Intellectual Property Office, the content of which is incorporated herein by reference in its entirety.

BACKGROUND

1. Field

Aspects of embodiments of the present invention relate to a thin film transistor substrate, a display apparatus including the same, a method of manufacturing the thin film transistor substrate, and a method of manufacturing a display apparatus using the same. In particular, aspects of embodiments of the present invention relate to a thin film transistor substrate including a crystalline silicon layer having improved mobility characteristics, a display apparatus including the same, a method of manufacturing the thin film transistor substrate, and a method of manufacturing a display apparatus using the same.

2. Description of the Related Art

In general, a thin film transistor substrate refers to a structure in which one or more thin film transistors or capacitors are formed on a substrate. The thin film transistor of the thin film transistor substrate may include a crystalline silicon layer as an active layer. The crystalline silicon layer may be formed by crystallizing an amorphous silicon layer, and characteristics of the thin film transistor may be determined according to the crystallization method used and an environment during the crystallization.

However, in some conventional thin film transistor substrates, the characteristics of the thin film transistor formed on the substrate are not desirable, such that, when a display apparatus including the conventional thin film transistor substrate is implemented, an image having non-uniform luminance may be displayed even when the same electrical signal is applied to a plurality of pixels.

SUMMARY

Aspects of embodiments of the present invention include a thin film transistor substrate including a crystalline silicon layer having improved mobility characteristics, a display apparatus including the same, a method of manufacturing the thin film transistor substrate, and a method of manufacturing a display apparatus using the same.

Additional aspects of the present invention will be set forth, in part, in the description which follows and, in part, will be apparent from the description and further in view of the particular embodiments described herein.

According to one or more exemplary embodiments of the present invention, a thin film transistor substrate includes: a substrate; a crystalline silicon layer on the substrate; and a capping layer covering the crystalline silicon layer and including a first portion having a first thickness and a second portion having a second thickness that is greater than the first thickness.

Both the first portion of the capping layer and the second portion of the capping layer may contact the crystalline silicon layer.

The thin film transistor substrate may further include a gate electrode on the capping layer.

The capping layer may further include a third portion having a third thickness that is greater than the first thickness, and the first portion of the capping layer may be between the second portion and the third portion of the capping layer.

Each of the first portion, the second portion, and the third portion of the capping layer may contact the crystalline silicon layer.

The thin film transistor substrate may further include a gate electrode on the capping layer. The gate electrode may correspond to the first portion of the capping layer.

The thin film transistor substrate may further include a source electrode contacting the crystalline silicon layer and a drain electrode contacting the crystalline silicon layer.

According to one or more exemplary embodiments of the present invention, a display apparatus includes: the above-described thin film transistor substrate; and a display device electrically connected to the source electrode or the drain electrode.

According to one or more exemplary embodiments of the present invention, a method of manufacturing a thin film transistor substrate includes: forming an amorphous silicon layer on a substrate; forming a capping layer on the amorphous silicon layer, the capping layer covering the crystalline silicon layer and including a first portion having a first thickness and a second portion having a second thickness that is greater than the first thickness; and converting the amorphous silicon layer into a crystalline silicon layer.

The forming of the capping layer may include forming the capping layer such that both the first portion and the second portion of the capping layer contact the amorphous silicon layer.

The converting of the amorphous silicon layer into the crystalline silicon layer may include irradiating a laser beam onto the first portion and the second portion of the capping layer.

The forming of the capping layer may include forming the capping layer including the first portion, the second portion, and a third portion having a third thickness that is greater than the first thickness, and the first portion of the capping layer may be between the second portion and the third portion of the capping layer.

The forming of the capping layer may include forming the capping layer such that each of the first portion, the second portion, and the third portion of the capping layer contacts the amorphous silicon layer.

The converting of the amorphous silicon layer into the crystalline silicon layer may include irradiating the first portion, the second portion, and the third portion of the capping layer with a laser beam.

The method may further include forming a source electrode and a drain electrode that contact the crystalline silicon layer.

According to one or more exemplary embodiments of the present invention, a method of manufacturing a display apparatus includes: preparing a thin film transistor substrate by using the above-described method; and forming a display device electrically connected to a source electrode or a drain electrode.

BRIEF DESCRIPTION OF THE DRAWINGS

These and/or other aspects of the present invention will become apparent and more readily appreciated from the following description of exemplary embodiments, taken in conjunction with the accompanying drawings, in which.

DETAILED DESCRIPTION

Figure 1:
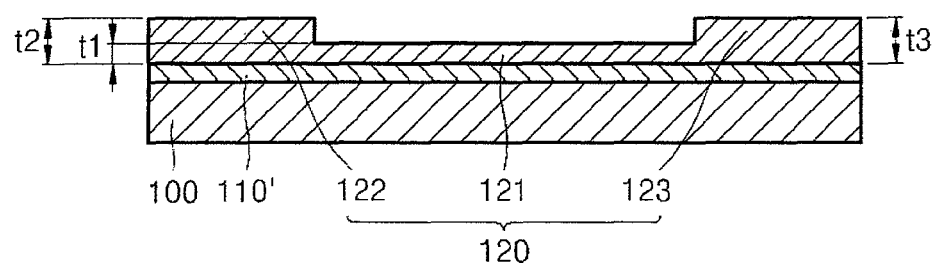
FIGS. 1 and 2 are cross-sectional views schematically illustrating processes of a thin film transistor manufacturing method according to an exemplary embodiment of the present invention.

Reference will now be made in detail to exemplary embodiments of the present invention, examples of which are illustrated in the accompanying drawings, wherein like reference numerals refer to like elements throughout the specification and drawings. In this regard, embodiments of the present invention may have different forms and should not be construed as being limited to the descriptions set forth herein. Accordingly, exemplary embodiments of the present invention are merely described below by way of example, by referring to the figures, to explain aspects of embodiments of the present invention. As used herein, the term "and/or" includes any and all combinations of one or more of the associated listed items. Expressions, such as "at least one of," when preceding a list of elements, modify the entire list of elements and do not modify the individual elements of the list. It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments. Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "use," "using," and "used" may be considered synonymous with the terms "utilize," "utilizing," and "utilized," respectively.

The terminology used herein is for the purpose of describing particular example embodiments only and is not intended to be limiting of example embodiments. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The inventive concept may include various embodiments and modifications, and exemplary embodiments of the inventive concept are illustrated in the drawings and will be described herein in detail. Various aspects and features of the inventive concept and the accomplishing methods thereof will be more apparent from the following description of exemplary embodiments, taken in conjunction with the accompanying drawings. However, the inventive concept is not limited to the exemplary embodiments described below, and the inventive concept may be embodied in various forms.

It will be understood that when an element such as a layer, a film, a region, area, or substrate is referred to as being "formed on" another element, it may be directly or indirectly formed on the other element. That is, for example, intervening elements may be present. It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Sizes of elements or layers in the drawings may be exaggerated for convenience of description. In other words, because sizes and thicknesses of elements or layers in the drawings may be arbitrarily illustrated for convenience of description, the following embodiments are not limited thereto. Also, the term "exemplary" is intended to refer to an example or illustration.

Figure 2:
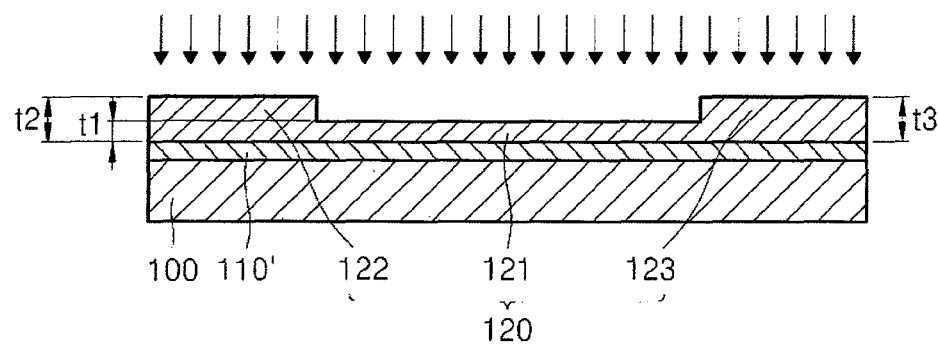

FIGS. 1 and 2 are cross-sectional views schematically illustrating processes of a thin film transistor substrate manufacturing method according to an exemplary embodiment of the present invention.

First, an amorphous silicon layer 110' is formed on a substrate 100. The substrate 100 may include glass, plastic, or metal. However, embodiments of the present invention are not limited thereto. For example, in some embodiments, a buffer layer including a silicon oxide or a silicon nitride may be formed on the substrate 100, and the amorphous silicon layer 110' may be formed on the buffer layer.

Then, a capping layer 120, which includes a first portion 121 having a first thickness t1 and a second portion 122 having a second thickness t2 which is greater than the first thickness t1, is formed on the amorphous silicon layer 110'. FIG. 1 illustrates that the capping layer 120 may further include a third portion 123 in addition to the first portion 121 and the second portion 122. In this embodiment, the third portion 123 has a third thickness t3 which is greater than the first thickness t1. The first portion 121 is interposed between the second portion 122 and the third portion 123 as illustrated in FIG. 1. In some embodiments, the third thickness t3 of the third portion 123 may only be (e.g., may only need to be) greater than the first thickness t1 of the first portion 121, and, for example, the third thickness t3 may be equal to the second thickness t2. FIG. 1 illustrates that the first portion 121 is interposed between the second portion 122 and the third portion 123. However, in some embodiments, the second portion 122 and the third portion 123 may be connected to each other to cover the first portion 121.

The capping layer 120 may be formed of a material having low thermal conductivity, for example, a silicon oxide, a silicon nitride, an aluminum oxide, and/or a silica gel.

As illustrated in FIG. 2, a laser beam, such as an excimer laser beam, is irradiated onto the capping layer 120 to convert the amorphous silicon layer 110' into a crystalline silicon layer. When the capping layer 120 is irradiated with the laser beam, the amorphous silicon layer 110' under the capping layer 120 is heated to be melted or nearly melted, and then, the capping layer 120 is cooled to be crystallized. In these embodiments, because the capping layer 120 is located on the amorphous silicon layer 110', the amorphous silicon layer 110' is selectively crystallized.

Figure 3:
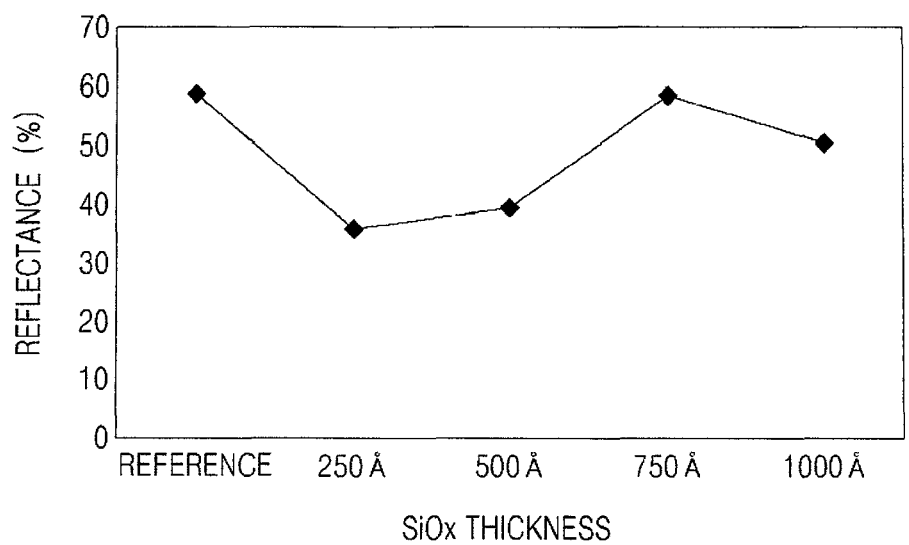
FIG. 3 is a graph schematically illustrating reflectance of a laser beam depending on the thickness of a capping layer.

FIG. 3 is a graph schematically illustrating reflectance of a laser beam depending on the thickness of the capping layer 120. In FIG. 3, "reference" refers to reflectance of a laser beam with a wavelength of about 308 nm that is directly irradiated onto an amorphous silicon layer (e.g., when no capping layer is present), and the other values refer to reflectances of the laser beam with a wavelength of about 308 nm that is irradiated onto the silicon oxide layer formed on the amorphous silicon layer having the various indicated thicknesses. As may be seen from the graph of FIG. 3, the measured reflectance of the laser beam at the silicon oxide layer varies according to the thickness of the silicon oxide layer. For example, the measured reflectance of the laser beam when the thickness of the silicon oxide layer is about 250 Å is much lower (about 35%) than the reflectance when the thickness of the silicon oxide layer is about 750 Å (about 60%).

As described above, according to the thin film transistor manufacturing method according to exemplary embodiments of the present invention, the thickness of the capping layer 120 is not uniform but varies according to positions on the substrate. Accordingly, in some embodiments, various portions of the amorphous silicon layer 110' are differently crystallized (e.g., not all portions of the amorphous silicon layer 110' are equally crystallized).

For example, when the first thickness t1 of the first portion 121 of the capping layer 120 is about 250 Å and the second thickness t2 of the second portion 122 and the third thickness t3 of the third portion 123 are about 750 Å, an amount of light from a laser beam absorbed by the first portion 121 of the capping layer 120 is greater than the amount of light from the laser beam absorbed by the second portion 122 and the third portion 123 of the capping layer 120. As a result, more energy may be transferred through the first portion 121 of the capping layer 120 to the amorphous silicon layer 110' therebelow than through portions corresponding to the second portion 122 and the third portion 123 of the capping layer 120 to the amorphous silicon layer 110' therebelow. Accordingly, during the crystallization process, when a portion of the amorphous silicon layer 110' below the first portion 121 of the capping layer 120 is heated, melted, or nearly melted, and then cooled, the crystallization progresses horizontally from the first portion 121 toward the second portion 122 or the third portion 123 of the amorphous silicon layer 110'.

In some embodiments, due to such horizontal crystallization, the amorphous silicon layer 110' may be converted into a crystalline silicon layer having relatively high mobility characteristics. Further, in some embodiments, the mobility of the crystalline silicon layer may be adjusted by adjusting thicknesses of respective portions of the capping layer 120. The horizontal crystallization direction of the amorphous silicon layer may also be adjusted by changing (e.g., adjusting or varying) the position(s) of the second portion 122 and/or the third portion 123 of the capping layer 120.

In some embodiments, the laser beam is irradiated onto each of (e.g., all of) the first portion 121, the second portion 122, and the third portion 123 of the capping layer 120. For example, in some embodiments, the first portion 121 is heated, melted, or nearly melted, and then cooled, and the second portion 122 and the third portion 123 are crystallized horizontally toward the first portion 121 after formation of a seed (e.g., a seed crystal).

While irradiation using a laser beam is described above, other methods may also be used for the crystallization. For example, the amorphous silicon layer 110' may be crystallized by heating (heat treatment). In these embodiments, because the second portion 122 and/or the third portion 123 of the capping layer 120 is thicker than the first portion 121, more energy may be transferred to a portion of the amorphous silicon layer 110' corresponding to (e.g., below) the first portion 121 of the capping layer 120 than to a portion of the amorphous silicon layer 110' corresponding to the second portion 122 and/or the third portion 123 of the capping layer 120. Accordingly, the crystallization may progress horizontally toward the first portion 121 from the second portion 122 and/or the third portion 123 of the amorphous silicon layer 110'.

The capping layer 120 may be formed by various methods. For example, a material, such as a silicon oxide, may be formed having a uniform thickness to cover the amorphous silicon layer 110', and then, a top portion (e.g., an upper surface) of a portion of the capping layer 120 corresponding to a selected portion of the amorphous silicon layer 110' may be removed to form the capping layer 120 (e.g., to form the first portion 121 of the capping layer 120 as illustrated in FIGS. 1 and 2). In this embodiment, the portion of the capping layer 120 corresponding to the selected portion is the first portion 121. As another example, a silicon oxide layer may be formed having a uniform thickness to cover the amorphous silicon layer 110', and then, an additional silicon oxide layer or a material layer having lower thermal conductivity than the silicon oxide layer may be formed on a portion of the silicon oxide layer corresponding to a selected portion of the amorphous silicon layer 110' to form the capping layer 120 (e.g., to form the second portion 122 and/or the third portion 123 of the capping layer 120 as illustrated in FIGS. 1 and 2). In this embodiment, the capping layer 120 has a single-layer structure at the first portion 121 and has a multi-layer structure at the second portion 122 and/or the third portion 123.

In another embodiment, instead of forming the capping layer 120 as illustrated in FIG. 1 or 2, the first portion 121 of the capping layer 120 may not be present such that a laser beam may directly reach (e.g., may be directly irradiated on) a portion of the amorphous silicon layer 110' corresponding to a portion between the second portion 122 and the third portion 123 of the capping layer 120. Also, in this embodiment, the crystallization may progress from the portions of the amorphous silicon layer 110' corresponding to the second portion 122 and the third portion 123 of the capping layer 120 toward the portion of the amorphous silicon layer 110' onto which the laser beam is directly irradiated. However, in this embodiment, because a corresponding portion of the amorphous silicon layer 110' is also removed in the process of removing a portion of the capping layer in order to form the capping layer having the above-described structure, the thickness of the portion of the amorphous silicon layer 110' may be reduced (e.g., may decrease).

According to the thin film transistor substrate manufacturing method according to an embodiment of the present invention, because the amorphous silicon layer 110' is not exposed during the process of forming the crystalline silicon layer, damage to the amorphous silicon layer 110' may be reduced or prevented and the amorphous silicon layer 110' may be converted into a crystalline silicon layer having improved mobility characteristics. Also, according to the thin film transistor substrate manufacturing method according to an embodiment of the present invention, because the amorphous silicon layer 110' is not exposed during the process of forming the crystalline silicon layer, the mobility or off-current characteristics may be uniform among a plurality of thin film transistors when the plurality of thin film transistors are formed.

As described above, the laser beam is irradiated onto the capping layer 120, and the energy of the laser beam is transferred through the capping layer 120 to the amorphous silicon layer 110'. Thus, in consideration of the energy transfer efficiency of the laser beam, it may be preferable, in one embodiment, that the capping layer 120 and the amorphous silicon layer 110' may directly contact each other. For example, during the process of forming the capping layer 120, it may be preferable, in one embodiment, that all of the first portion 121, the second portion 122, and the third portion 123 of the capping layer 120 may contact the amorphous silicon layer 110' and may be located on the amorphous silicon layer 110'.

Figure 4:
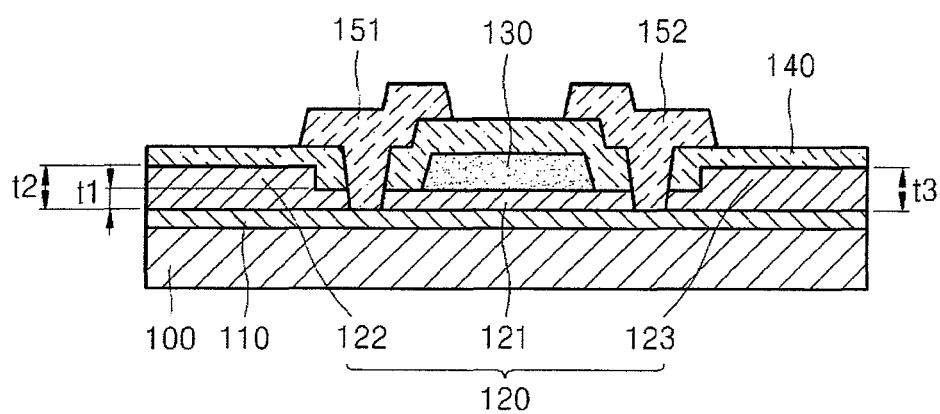
FIG. 4 is a cross-sectional view schematically illustrating a thin film transistor according to an exemplary embodiment of the present invention.

After the crystallization of the amorphous silicon layer 110', a gate electrode 130, an insulating layer 140, a source electrode 151, and a drain electrode 152 are formed as illustrated in FIG. 4, thereby manufacturing a thin film transistor substrate. The gate electrode 130 may be formed to correspond to the first portion 121 of the capping layer 120, and the insulating layer 140 may be interposed between the source electrode 151 and the drain electrode 152 and the gate electrode 130 to insulate the source electrode 151 and the drain electrode 152 from the gate electrode 130.

The source electrode 151 and the drain electrode 152 may directly contact a crystalline silicon layer 110 through a contact opening (e.g., a contact hole) formed in the capping layer 120 or the insulating layer 140. In one embodiment, it may be preferable that the source electrode 151 and the drain electrode 152 may contact a portion of the crystalline silicon layer 110 corresponding to the first portion 121 of the capping layer 120 because mobility characteristics differ according to the regions of the crystalline silicon layer 110. For example, because the grain size of the portion of the crystalline silicon layer 110 corresponding to the first portion 121 of the capping layer 120 is different from the grain size of the portion of the crystalline silicon layer 110 corresponding to the second portion 122 and/or the third portion 123 of the capping layer 120, it may be preferable, in one embodiment, that a channel be formed at the portion of the crystalline silicon layer 110 corresponding to the first portion 121 of the capping layer 120 by bringing the source electrode 151 and the drain electrode 152 into contact with the portion of the crystalline silicon layer 110 corresponding to the first portion 121 of the capping layer 120 which is uniformly crystallized to have a uniform grain size and has improved mobility characteristics.

Although an embodiment in which the capping layer 120 includes the first portion 121, the second portion 122, and the third portion 123 has been described herein, the present invention is not limited thereto. For example, the capping layer 120 may include only the first portion 121 having the first thickness t1 and the second portion 122 having the second thickness t2 that is greater than the first thickness t1. In this embodiment, the capping layer 120 is formed such that each of (e.g., all of) the first portion 121 and the second portion 122 of the capping layer 120 contact the amorphous silicon layer 110' and are located on the amorphous silicon layer 110'. Also, when a laser beam is irradiated to convert the amorphous silicon layer 110' into a crystalline silicon layer, the laser beam is irradiated onto each of the first portion 121 and the second portion 122 of the capping layer 120. According to this process, a portion of the amorphous silicon layer 110' corresponding to the first portion 121 of the capping layer 120 may be converted into a crystalline silicon layer having improved mobility characteristics.

Although an embodiment of the thin film transistor substrate manufacturing method has been described herein, a display apparatus manufacturing method using the same is also included within the scope of the inventive concept. For example, after the thin film transistor substrate is prepared according to the above-described method, a pixel electrode electrically connected to the source electrode 151 or the drain electrode 152 may be formed to manufacture a display apparatus. For example, a planarization layer covering the source electrode 151 and the drain electrode 152 is formed, a pixel electrode contacting the drain electrode 152 through an opening (e.g., a through-hole) in the planarization layer is formed, an intermediate layer including an emission layer is formed on the pixel electrode, and an opposite electrode is formed thereon, thereby manufacturing an organic light-emitting display apparatus.

In the display apparatus manufactured according to this method, because the mobility of the crystalline silicon layer 110 of the thin film transistor controlling an operation of each pixel is improved and the off-current characteristics are uniform among a plurality of thin film transistors, the operations of pixels may be easily controlled and, thus, higher quality images may be displayed.

Although embodiments of the thin film transistor substrate manufacturing method and the display apparatus manufacturing method have been described herein, a thin film transistor substrate and a display apparatus is also included within the scope of the inventive concept.

A thin film transistor substrate according to an exemplary embodiment may have, for example, a structure as illustrated in FIG. 4. For example, the thin film transistor substrate according to an exemplary embodiment may include: a substrate 100; a crystalline silicon layer 110 disposed on the substrate 100; and a capping layer 120 covering the crystalline silicon layer 110 and including a first portion 121 having a first thickness t1 and a second portion 122 having a second thickness t2 that is greater than the first thickness t1. As illustrated in FIG. 4, the capping layer 120 may further include a third portion 123 having a third thickness t3 that is greater than the first thickness t1 in addition to the second portion 122. In one embodiment, the third thickness t3 of the third portion 123 may be greater than the first thickness t1 of the first portion 121 such that the third thickness t3 may be equal to the second thickness t2. FIG. 4 illustrates that the first portion 121 is interposed between the second portion 122 and the third portion 123. However, in some embodiments, the second portion 122 and the third portion 123 may be connected to each other to cover the first portion 121.

The capping layer 120 may include a material having low thermal conductivity, for example, a silicon oxide, a silicon nitride, an aluminum oxide, and/or a silica gel.

According to an embodiment of the present invention, when a laser beam is used to crystallize an amorphous silicon layer in order to form the crystalline silicon layer 110, because all regions of the amorphous silicon layer are covered by the capping layer 120, damage to the amorphous silicon layer may be effectively reduced or prevented. Also, because the first portion 121, the second portion 122, and the third portion 123 of the capping layer 120 have different thicknesses, a seed is generated at the portion of the amorphous silicon layer corresponding to the second portion 122 and the third portion 123 or at the neighborhood thereof and the crystallization is performed horizontally toward the first portion 121, and the crystalline silicon layer 110 may be formed to have improved mobility characteristics. Also, when the crystalline silicon layer 110 is formed by this crystallization method, the characteristics of the crystalline silicon layer 110 may be uniform among a plurality of thin film transistors that are concurrently (e.g., simultaneously) manufactured.

In the thin film transistor substrate according to an embodiment of the present invention, a laser beam is irradiated onto the capping layer 120 during the manufacturing process, and the energy of the laser beam is transferred through the capping layer 120 to the amorphous silicon layer. Thus, in consideration of the energy transfer efficiency of the laser beam, it may be preferable, in one embodiment, that the capping layer 120 and the amorphous silicon layer directly contact each other. For example, after the crystallization of the amorphous silicon layer, it may be preferable, in one embodiment, that each of the first portion 121, the second portion 122, and the third portion 123 of the capping layer 120 contact the crystalline silicon layer 110 and be located on the crystalline silicon layer 110.

The capping layer 120 may have a single-layer structure as illustrated in FIG. 1 or 2; however, the present invention is not limited thereto. For example, the capping layer 120 may have a single-layer structure at the first portion 121 and may have a multi-layer structure at the second portion 122 and/or the third portion 123. In this embodiment, the lowermost layer of the second portion 122 and/or the third portion 123 and a single layer of the first portion 121 may have the same thickness and may be united together. Also, a layer on the lowermost layer of the second portion 122 and/or the third portion 123 may include the same material as the lowermost layer or may include a material having lower thermal conductivity than the lowermost layer.

The thin film transistor substrate may include a gate electrode 130 that corresponds to the first portion 121 of the capping layer 120, and a source electrode 151 and a drain electrode 152 that are insulated from the gate electrode 130 and that contact the crystalline silicon layer 110. In some embodiments, the source electrode 151 and the drain electrode 152 may contact a portion of the crystalline silicon layer 110 corresponding to the first portion 121 of the capping layer 120. In some embodiments, mobility characteristics differ according to the regions of the crystalline silicon layer 110 because, for example, the grain size of the portion of the crystalline silicon layer 110 corresponding to the first portion 121 of the capping layer 120 may be different from the grain size of the portion of the crystalline silicon layer 110 corresponding to the second portion 122 and/or the third portion 123 of the capping layer 120. Thus, in some embodiments a channel may be formed at the portion of the crystalline silicon layer 110 corresponding to the first portion 121 of the capping layer 120 by bringing the source electrode 151 and the drain electrode 152 into contact with the portion of the crystalline silicon layer 110 corresponding to the first portion 121 of the capping layer 120 which is uniformly (or substantially uniformly) crystallized to have a uniform (or substantially uniform) grain size and improved mobility characteristics. In some of these embodiments, the gate electrode 130 corresponds to the first portion 121 of the capping layer 120.

According to the above-described example embodiments, the capping layer 120 includes the first portion 121, the second portion 122, and the third portion 123. However, the present invention is not limited thereto. For example, the capping layer 120 may include only the first portion 121 having the first thickness t1 and the second portion 122 having the second thickness t2 which is greater than the first thickness t1. In some of these embodiments, each of the first portion 121 and the second portion 122 of the capping layer 120 contacts the crystalline silicon layer 110 and are located on the crystalline silicon layer 110.

According to an embodiment of the present invention, a display apparatus includes the thin film transistor substrate manufactured according to an embodiment of the present invention. A display apparatus according to an embodiment includes the thin film transistor substrate described above and a display device electrically connected to the source electrode 151 or the drain electrode 152. In the display apparatus, because the mobility of the crystalline silicon layer 110 of the thin film transistor controlling an operation of each pixel is improved and the off-current characteristics and/or other electrical characteristics are more uniform among a plurality of the thin film transistors, the operation of the display device may be more accurately and easily controlled and, thus, may display higher quality images.

As described above, according to the embodiments of the present invention, a thin film transistor substrate including a crystalline silicon layer has characteristics such as improved mobility. Additionally, according to other embodiments of the present invention provide: a display apparatus includes the thin film transistor substrate, a method of manufacturing the thin film transistor substrate, and a method of manufacturing a display apparatus using the thin film transistor substrate.

It should be understood that the embodiments of the present invention described herein should be considered in a descriptive sense only and not for purposes of limitation. Descriptions of features or aspects within each embodiment should be considered as available for other similar features or aspects in other embodiments.

While embodiments of the present invention have been described herein with reference to the figures, it will be understood by those of ordinary skill in the art that various changes in form and details may be made therein without departing from the spirit and scope of the inventive concept as defined by the following claims and equivalents thereof.

What is claimed is:
1. A thin film transistor substrate comprising:
a substrate;
a crystalline silicon layer on the substrate, the crystalline silicon layer comprising a source region, a drain region, and a channel between the source and drain regions;
a capping layer covering the crystalline silicon layer and comprising a first portion having a first thickness and a second portion having a second thickness that is greater than the first thickness;
a gate electrode on the capping layer, a bottom surface of the gate electrode being below an upper surface of the second portion of the capping layer in a direction normal to the substrate; and a source electrode contacting the source region of the crystalline silicon layer and a drain electrode contacting the drain region of the crystalline silicon layer, a distance between the second portion of the capping layer and the channel being greater than a distance between a contact position of the source electrode or the drain electrode on the crystalline silicon layer and the channel in a direction parallel to the substrate.

2. The thin film transistor substrate of claim 1, wherein both the first portion of the capping layer and the second portion of the capping layer contact the crystalline silicon layer.

3. The thin film transistor substrate of claim 1, wherein the capping layer further comprises a third portion having a third thickness,
wherein the third thickness is greater than the first thickness, and
wherein the first portion of the capping layer is between the second portion and the third portion of the capping layer.

4. The thin film transistor substrate of claim 3, wherein each of the first portion, the second portion, and the third portion of the capping layer contacts the crystalline silicon layer.

5. The thin film transistor substrate of claim 3, further comprising a gate electrode on the capping layer.

6. The thin film transistor substrate of claim 5, wherein the gate electrode corresponds to the first portion of the capping layer.

7. A display apparatus comprising:
the thin film transistor substrate of claim 1; and
a display device electrically connected to the source electrode or the drain electrode.

8. A method of manufacturing a thin film transistor substrate, the method comprising:
forming an amorphous silicon layer on a substrate;
forming a capping layer on the amorphous silicon layer, the capping layer covering the amorphous silicon layer and comprising a first portion having a first thickness and a second portion having a second thickness that is greater than the first thickness and such that an upper surface of the first portion of the capping layer being below an upper surface of the second portion of the capping layer in a direction normal to the substrate;
converting the amorphous silicon layer into a crystalline silicon layer, the crystalline silicon layer comprising a source region, a drain region, and a channel between the source and drain regions; and
forming a source electrode contacting the source region of the crystalline silicon layer and a drain electrode contacting the drain region of the crystalline silicon layer, a distance between the second portion of the capping layer and the channel being greater than a distance between a contact position of the source electrode or the drain electrode on the crystalline silicon layer and the channel in a direction parallel to the substrate.

9. The method of claim 8, wherein the forming of the capping layer comprises forming the capping layer such that both the first portion and the second portion of the capping layer contact the amorphous silicon layer.

10. The method of claim 8, wherein the converting of the amorphous silicon layer into the crystalline silicon layer comprises irradiating a laser beam onto the first portion and the second portion of the capping layer.

11. The method of claim 8, wherein the forming of the capping layer comprises forming the capping layer comprising the first portion, the second portion, and a third portion, the third portion having a third thickness that is greater than the first thickness, and
wherein the first portion of the capping layer is between the second portion and the third portion of the capping layer.

12. The method of claim 11, wherein the forming of the capping layer comprises forming the capping layer such that each of the first portion, the second portion, and the third portion of the capping layer contacts the amorphous silicon layer.

13. The method of claim 11, wherein the converting of the amorphous silicon layer into the crystalline silicon layer comprises irradiating the first portion, the second portion, and the third portion of the capping layer with a laser beam.

14. A method of manufacturing a display apparatus, the method comprising:
preparing a thin film transistor substrate using the method of claim 8; and
forming a display device electrically connected to the source electrode or the drain electrode.

15. A thin film transistor substrate comprising:
a substrate;
a crystalline silicon layer on the substrate, the crystalline silicon layer comprising a source region, a drain region, and a channel between the source and drain regions;
a capping layer covering the crystalline silicon layer and comprising a first portion having a first thickness and a second portion having a second thickness that is greater than the first thickness, an upper surface of the first portion of the capping layer being below an upper surface of the second portion of the capping layer in a direction normal to the substrate; and
a source electrode contacting the source region of the crystalline silicon layer and a drain electrode contacting the drain region of the crystalline silicon layer, the first portion of the capping layer corresponding to the crystalline silicon layer from a contact position of the source electrode or the drain electrode on the crystalline silicon layer to the channel.

16. The thin film transistor substrate of claim 1, wherein the crystalline silicon layer is between the second portion of the capping layer and the substrate in the direction normal to the substrate.

17. The thin film transistor substrate of claim 3, wherein a combined length of the second portion and the third portion of the capping layer in the direction parallel to the substrate is greater than a length of the first portion of the capping layer.

* * * * *